(12) United States Patent
Jeffries et al.

(10) Patent No.: US 6,249,428 B1
(45) Date of Patent: Jun. 19, 2001

(54) METHOD AND APPARATUS FOR MOUNTING A COMPONENT AND HEAT SINK

(75) Inventors: John Jeffries, Austin; Stephen Cook, Georgetown; Gilberto Hernandez, Round Rock, all of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/232,150

(22) Filed: Jan. 15, 1999

(51) Int. Cl.$^7$ .............................. H05K 9/00; H05K 7/00; G06F 1/16
(52) U.S. Cl. ........................ 361/684; 361/688; 361/697
(58) Field of Search .................................. 361/684, 685, 361/688, 690, 697

(56) References Cited

U.S. PATENT DOCUMENTS

| | | |
|---|---|---|
| 5,436,798 | 7/1995 | Wieland, Jr. . |
| 5,509,465 | 4/1996 | Lai . |
| 5,519,574 | 5/1996 | Kodama et al. . |
| 5,544,013 | 8/1996 | Chiou . |
| 5,597,035 | 1/1997 | Smith et al. . |
| 5,664,622 | 9/1997 | Chiou . |
| 5,678,627 | 10/1997 | Lee . |
| 5,706,169 | 1/1998 | Yeh . |
| 5,730,210 | 3/1998 | Kou . |
| 5,734,550 | 3/1998 | Penniman et al. . |
| 5,854,738 | * 12/1998 | Bowler ................................. 361/695 |
| 5,940,266 | * 8/1999 | Hamilton et al. ..................... 361/695 |
| 5,947,192 | * 9/1999 | Kuo ................................ 361/697 X |
| 5,973,921 | * 10/1999 | Lin ........................................ 361/695 |
| 6,053,760 | * 4/2000 | Bailis et al. ...................... 361/690 X |
| 6,058,007 | * 5/2000 | Eckert et al. .................... 361/685 X |
| 6,064,568 | * 5/2000 | Schmitt ................................ 361/685 |
| 6,075,694 | * 6/2000 | Mills et al. .......................... 361/685 |
| 6,078,504 | * 6/2000 | Miles ............................... 361/684 X |
| 6,094,342 | * 7/2000 | Dague et al. ........................ 361/685 |

\* cited by examiner

*Primary Examiner*—Jeffrey Donels
(74) *Attorney, Agent, or Firm*—Haynes and Boone, L.L.P.

(57) ABSTRACT

A method and apparatus is described for mounting a component in a computer chassis. The present embodiment includes an embodiment in which the component is associated with a heat sink. A mounting bracket, including at least one slot, is disposed on a component. At least one fastener affixes the mounting bracket and component to the chassis. In an alternative embodiment, the component can be secured to an interposer plate affixed to the chassis. The plate includes threaded openings for engaging the fasteners. A second supporting means engages the mounting bracket also. In the present embodiment, the second supporting means is a cover including at least one tab. When the cover is coupled with the chassis, the tabs align with and engage the slots of the mounting bracket. A guide is described for aligning an electrical connector of the component with a corresponding connector of the computer, wherein the connectors make the electrical connection as the component is secured to the chassis.

12 Claims, 3 Drawing Sheets

METHOD AND APPARATUS FOR MOUNTING A COMPONENT AND HEAT SINK

BACKGROUND

This disclosure relates generally to personal computers ("PCs"), and more particularly to a method and apparatus for mounting relatively heavy components in a PC.

PCs contain many components that generate heat and, in some instances, heat sinks are attached to the components to dissipate heat. However, heat sinks are relatively heavy, and must be supported to withstand shock and vibrations. Further, the component itself is often relatively heavy, for example, as with the Intel Xeon processor.

In view of the heaviness, the conventional method of mounting such a component and heat sink includes using massive plastic parts to secure the component, and requires the motherboard to become a structural support. Conventional methods are undesirable for several reasons. First, the plastic parts impede airflow over the heat sink, making it less effective. Second, requiring the motherboard to support the component wastes space and places stress on the motherboard, creating manufacturing and assembly problems. Third, many components must be mounted precisely, which can be difficult without a guide.

Therefore, what is needed is a mounting system for a component and a heat sink that minimalizes airflow restrictions, helps seat the component correctly, and reduces the number of components using the motherboard for support. Decreasing the number of components using the motherboard for support reduces stress on the motherboard and makes board design easier, resulting in smaller, more cost effective motherboards.

SUMMARY

Accordingly, the present embodiment relates to a method and apparatus for mounting a component in a computer chassis. The present embodiment includes an embodiment in which the component is associated with a heat sink. A mounting bracket, including at least one slot, is disposed on a component. At least one fastener affixes the mounting bracket and component to the chassis. In an alternative embodiment, the component can be secured to an interposer plate affixed to the chassis. The plate includes threaded openings for engaging the fasteners. A second supporting means engages the mounting bracket also. In the present embodiment, the second supporting means is a cover including at least one tab. When the cover is coupled with the chassis, the tabs align with and engage the slots of the mounting bracket. A guide is described for aligning an electrical connector of the component with a corresponding connector of the computer, wherein the connectors make the electrical connection as the component is secured to the chassis.

A principal advantage of the above apparatus are that it requires less space and minimizes airflow restrictions and stress on the motherboard. Other advantages of the method and apparatus are that they create a more stable support for the component, and help seat the component properly. Yet another advantage is that it is a simpler design, thus easier to manufacture.

DESCRIPTION OF A PREFERRED EMBODIMENT

Figure 1:
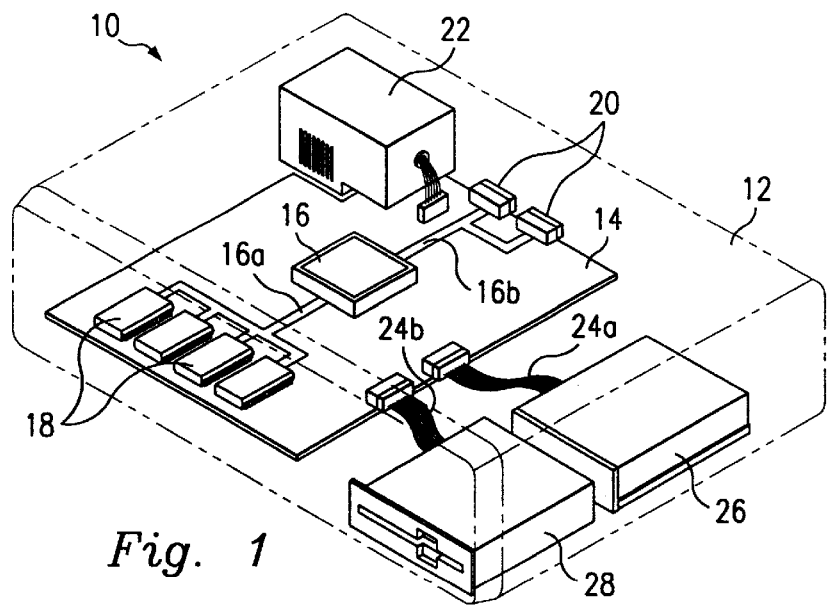
FIG. 1 is a diagrammatic view of a computer according to an embodiment of the present apparatus.

FIG. 1 depicts a PC, designated generally by a reference numeral 10, which may be, for example, a desktop PC, a portable PC, or a tower PC. The PC 10 includes a chassis 12 in which a motherboard 14 is mounted. A processor 16, a plurality of memory devices or modules 18, and one or more input/output (I/O) devices, represented in FIG. 1 by two I/O devices 20, are mounted on the motherboard 14. Two buses 16a and 16b are also provided on the motherboard 14 and connect the processor 16 to the memory modules 18 and to the input/output devices 20, respectively. A power supply 22 is connected to the motherboard 14, and a pair of cable assemblies 24a and 24b connect the motherboard to a hard disk drive unit 26 and a floppy disk drive unit 28, respectively. It is understood that other components, electrical traces, electrical circuits and related devices (not shown) are provided in the chassis 12. Since these are all conventional, they will not be described in any further detail.

Figure 2:
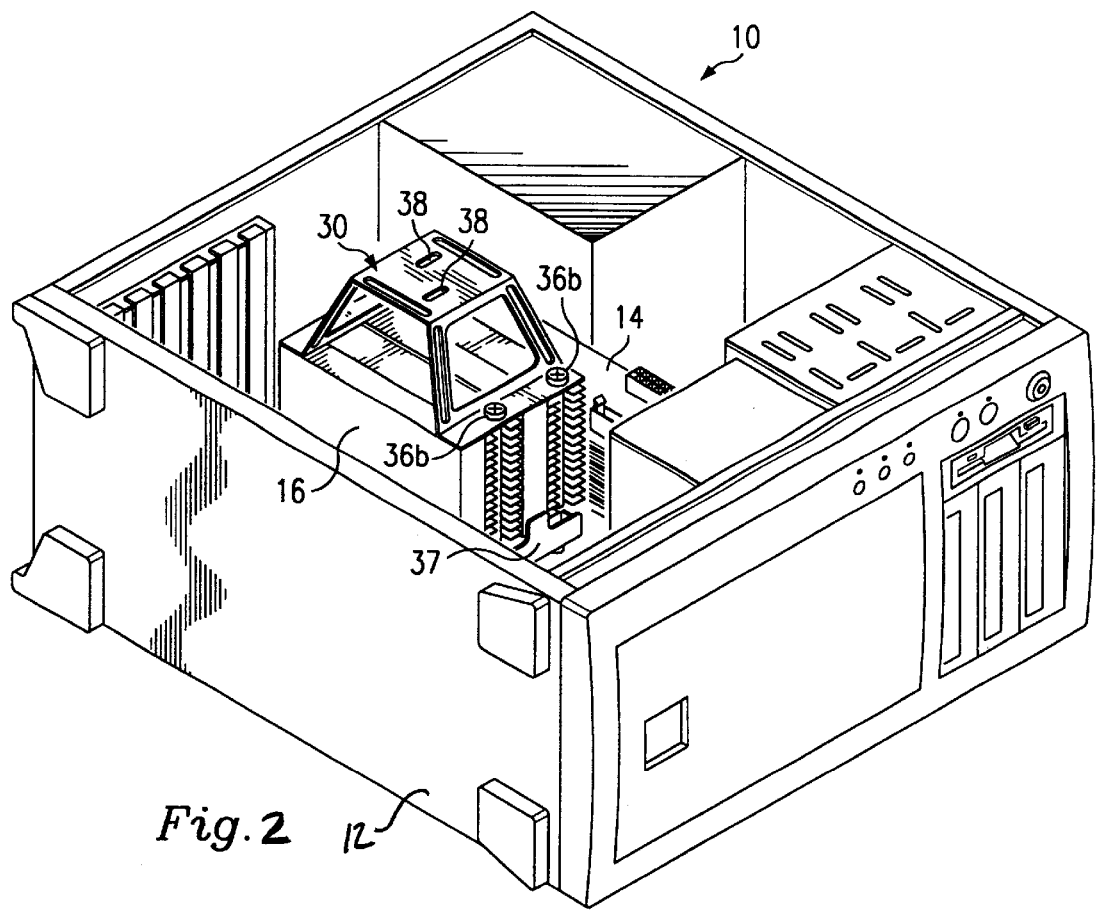
FIG. 2 is an exploded view of an embodiment of the present apparatus.
Figure 3:
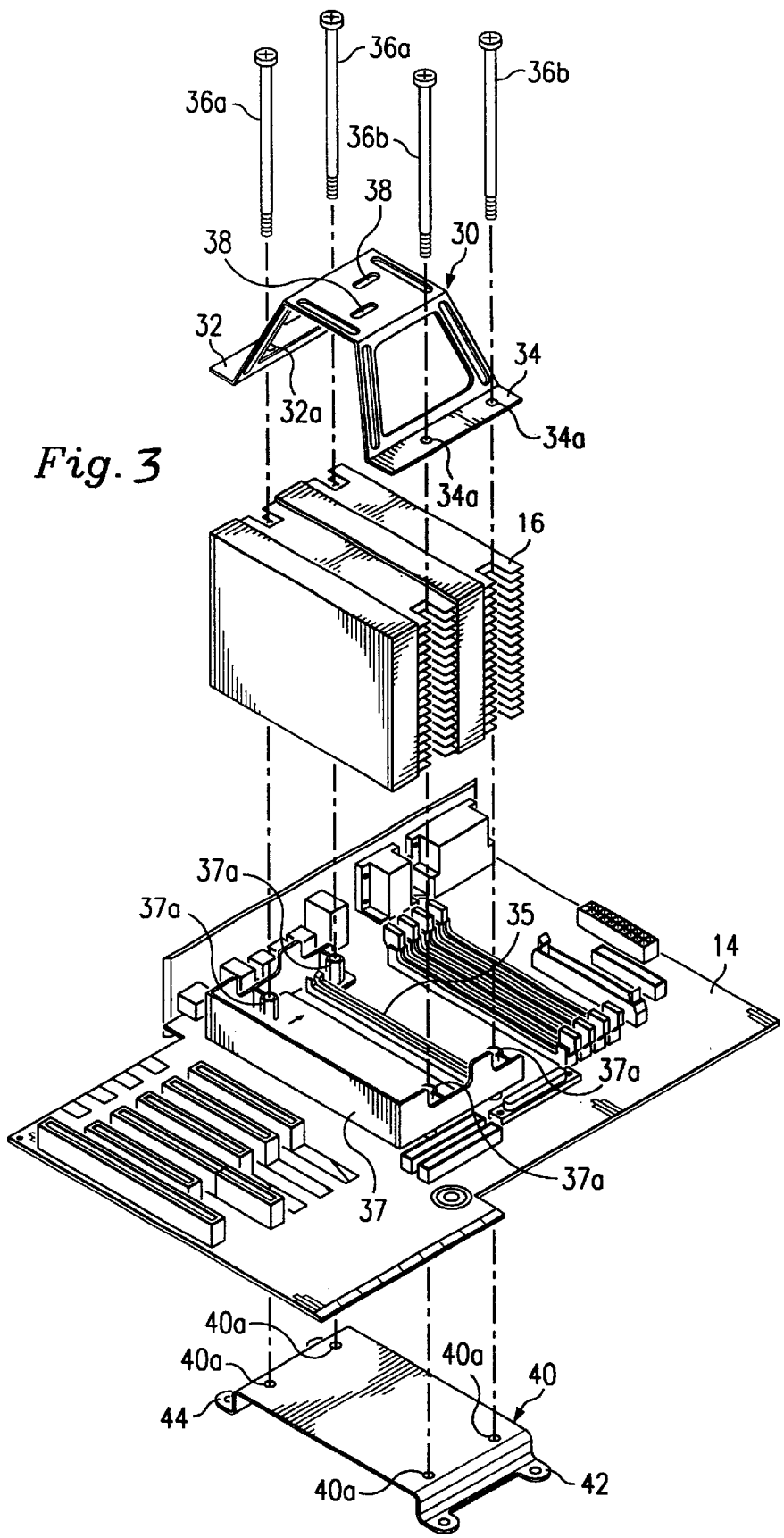
FIG. 3 illustrates the embodiment of FIG. 2 disposed in the interior of the PC chassis of FIG. 1.

FIGS. 2 and 3 illustrate the mounting of the processor 16 to the chassis 12. To this end, a mounting bracket 30 extends over the processor 16 and is substantially U-shaped in cross section, having two flanges 32 and 34 extending at each end thereof. Two openings, one of which is shown by the reference numeral 32a, are provided through the flange 32 and two openings 34a are provided through the flange 34. Also, two bolts 36a are provided that extend through the openings 32a in the flange 32 and two bolts 36b extend through the openings 34a in the flange 34 for reasons to be described. Two slots 38 are provided in the base or top plate portion of the bracket 30 for reasons to be described.

The bolts 36a and 36b extend through the openings 32a and 34a, respectively, and also through substantially U-shaped end portions of the processor 16.

A guide 37 is mounted on the motherboard 14 by any known manner, such as by plastic rivets or the like. The leading portion of the bolts 36a and 36b then pass through openings 37a formed in the guide 37. The guide 37 serves two functions. First, it guides an electrical connector (not shown) of the processor 16 to an electrical connector 35 disposed on the motherboard 14, assuring that the connectors are correctly aligned. Second, the guide openings 37a direct the leading portion of the bolts 36a and 36b through the motherboard 14. The motherboard 14 is not used for support of the processor 16.

An interposer plate 40 extends from the chassis 12. The interposer plate 40 is substantially U-shaped in cross section, having two flanges 42 and 44 extending at each end thereof. The plate 40 is mounted by any known manner, such as by screws or the like, through conventional openings in the flanges 42 and 44 to secure the interposer plate to the chassis 12. The top plate of the interposer plate has threaded openings 40a to receive the bolts 36a and 36b. It is understood that the bolts 36a and 36b could alternatively connect directly to the chassis.

To mount the processor 16 to the chassis 12, the bolts 36a and 36b pass through the mounting bracket openings 32a and 34a, processor 16, guide openings 37a, and motherboard 14, to engage openings 40a of the interposer plate 40.

The interposer plate 40 is affixed to the chassis 12. As the bolts are tightened, the processor 16 is simultaneously secured to the chassis 12 and seated to create an electrical connection via conventional cooperating male and female connectors, which will not be shown in detail.

Figure 4:
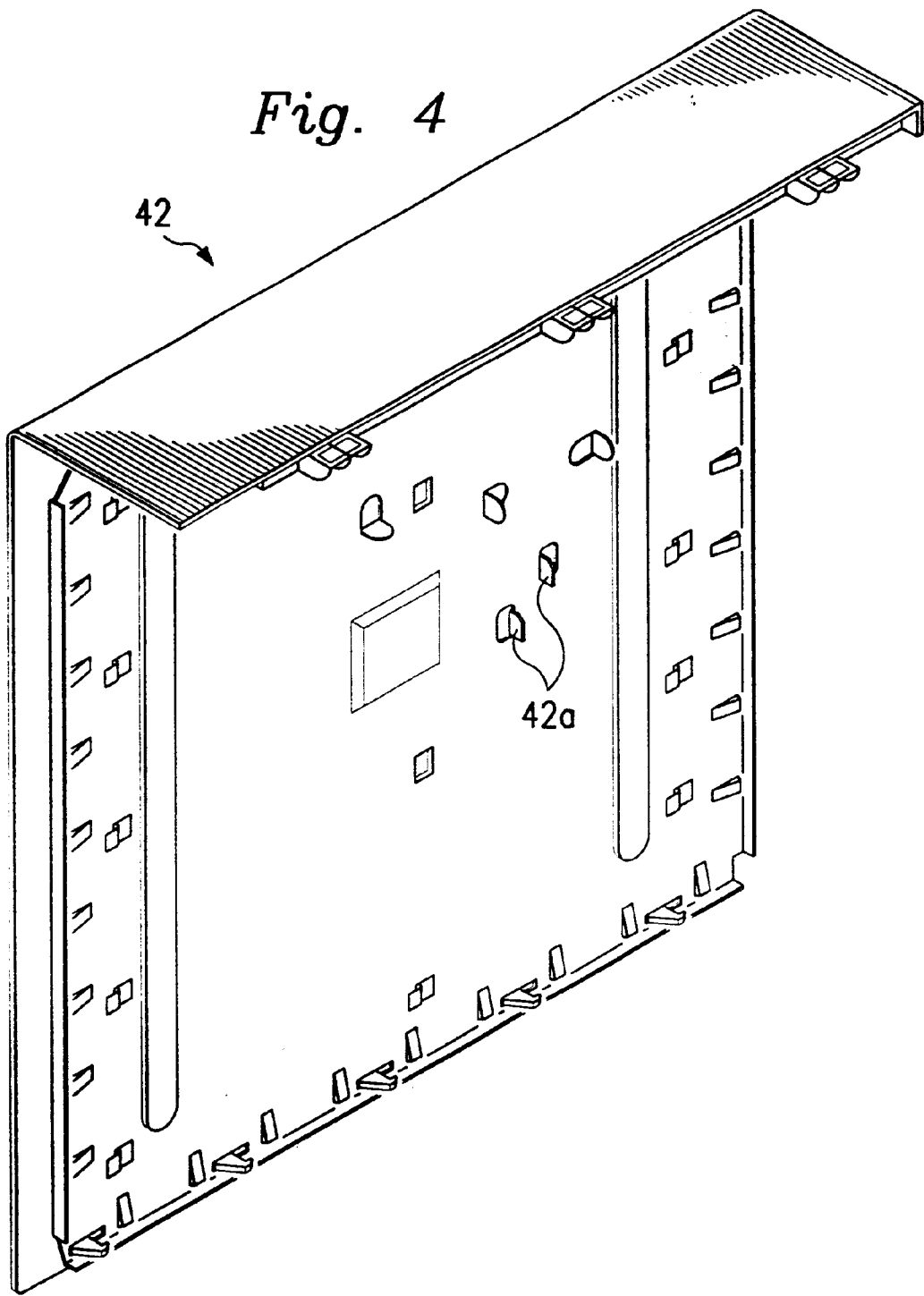
FIG. 4 illustrates a PC cover with connecting tabs, forming a part of the present apparatus.

FIG. 4 illustrates the PC cover 42, which has tabs, collectively 42a. As mentioned above, two slots 38 are provided in the base or top plate portion of the bracket 30. When the cover is attached to the chassis 12, the tabs 42a engage the mounting bracket slots 38. The cooperating tabs and slots provide additional support from shock and vibration for the mounted component.

As can be seen, the principal advantage of the present embodiment is that the processor, or any component, can be mounted without using the motherboard for support, thus reducing stress on the motherboard, saving space, and promoting simpler design layout. Further, the component is supported from two sides, a more stable arrangement.

This disclosure shows and describes illustrative embodiments, such as the processor, however, the disclosure contemplates a wide range of modifications, changes and substitutions. Such variations may employ only some features of the embodiments without departing from the scope of the underlying embodiment. Accordingly, any appropriate construction of the appended claims will reflect the broad scope of the underlying embodiment.

What is claimed is:

1. A computer comprising:
   a chassis;
   a component for mounting within the chassis;
   a mounting bracket engaging the component, and including at least one slot;
   at least one fastener to affix the mounting bracket and component to the chassis;
   a second supporting means for engaging the at least one slot of the mounting bracket; and
   an interposer plate affixed to the chassis, wherein the mounting bracket and component are secured to the plate by the fastener in combination with a guide associated with the component for aligning an electrical connector of the component with a corresponding connector of the computer.

2. The computer of claim 1 wherein the second supporting means comprises:
   a cover for coupling with the chassis, and
   at least one tab associated with the cover, said tab aligning with and engaging the at least one slot of the mounting bracket when the cover is coupled with the chassis.

3. The computer of claim 1 wherein the component is associated with a heat sink.

4. The computer of claim 1 wherein the interposer plate affixed to the chassis includes threaded openings for engaging the at least one fastener.

5. The computer of claim 4 wherein the guide allows the at least one fastener to pass through the guide, simultaneously aiming the at least one fastener toward the threaded openings in the interposer plate.

6. A method for installing a component in a computer chassis, comprising the steps of:
   providing a mounting bracket including at least one slot;
   positioning the mounting bracket on the component;
   providing a guide for guiding an electrical connector of the component to a corresponding electrical connector of the computer;
   providing an interposer plate connected to the chassis, including threaded openings for engaging at least one fastener, wherein the at least one fastener provides a first means for securing the component against movement and vibration;
   securing the mounting bracket and component to the interposer plate, and thus to the chassis, with the at least one fastener, wherein the step of securing also secures the electrical connection between the and the corresponding computer connectors;
   providing a cover including at least one tab; and
   inserting the at least one tab into the at least one slot of the mounting bracket, wherein the cooperating tab and slot provide a second means for securing the component against movement and vibration.

7. A computer comprising:
   a chassis;
   an interposer plate mounted to the chassis;
   a component for mounting in the chassis;
   a mounting bracket engaging the component;
   a guide associated with the component, for aligning an electrical connector of the component with a corresponding connector of the computer, wherein the electrical connection is made as the component is secured; and
   at least one fastener extending through an opening in the bracket and received by the interposer plate for securing the component against movement and vibration.

8. The computer of claim 7 wherein the chassis further comprises a cover having at least one tab extending from the cover for engagement into a corresponding slot formed in the mounting bracket.

9. A computer comprising:
   a chassis;
   a component for mounting within the chassis;
   a mounting bracket engaging the component, and including at least one slot;
   a cover having at least one tab extending from the cover for engagement into the slot formed in the mounting bracket, whereby the component is secured against movement and vibration; and
   at least one fastener connecting the mounting bracket to an interposer plate associated with the chassis, thereby affixing the mounting bracket and component to the chassis.

10. The computer of claim 9 wherein the component is associated with a heat sink.

11. The computer of claim 9 further comprising a guide associated with the component, for aligning an electrical connector of the component with a corresponding connector of the computer, wherein the electrical connection is made as the component is secured.

12. The computer of claim 9 wherein the guide allows the at least one fastener to pass through the guide, simultaneously aiming the at least one fastener toward threaded openings in the interposer plate.

* * * * *